(12) United States Patent
Abe

(10) Patent No.: US 9,385,766 B2
(45) Date of Patent: Jul. 5, 2016

(54) DIGITAL SIGNAL PROCESSING DEVICE, RECEIVING DEVICE, AND SIGNAL TRANSMITTING AND RECEIVING SYSTEM

(71) Applicant: NEC Corporation, Tokyo (JP)

(72) Inventor: Junichi Abe, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/381,223

(22) PCT Filed: Jan. 10, 2013

(86) PCT No.: PCT/JP2013/000044
§ 371 (c)(1),
(2) Date: Jan. 29, 2015

(87) PCT Pub. No.: WO2013/128783
PCT Pub. Date: Sep. 6, 2013

(65) Prior Publication Data
US 2015/0333783 A1 Nov. 19, 2015

(30) Foreign Application Priority Data
Mar. 1, 2012 (JP) .................................. 2012-045962

(51) Int. Cl.
*H04B 15/00* (2006.01)
*H04B 1/10* (2006.01)
(Continued)

(52) U.S. Cl.
CPC ......... *H04B 1/1027* (2013.01); *H03H 17/0213* (2013.01); *H03H 21/0027* (2013.01); *H04B 1/123* (2013.01); *H04L 27/10* (2013.01); *H03H 2021/0092* (2013.01)

(58) Field of Classification Search
CPC . H04B 3/32; H04L 25/03038; H04L 27/2647
USPC ................................. 375/285, 350, 316, 346
See application file for complete search history.

(56) References Cited

U.S. PATENT DOCUMENTS 5,237,416 A * 8/1993 Ito et al. ........................ 348/614
5,293,234 A * 3/1994 Ko .................................. 348/614
(Continued)

FOREIGN PATENT DOCUMENTS

JP 03-133219 6/1991
JP 04-196771 7/1992
(Continued)

OTHER PUBLICATIONS

Seb J. Savory, "Digital filters for coherent optical receivers", Optics Express vol. 16, No. 2, pp. 804-817 (Jan. 2008).
(Continued)

*Primary Examiner* — Helene Tayong
(74) *Attorney, Agent, or Firm* — Young & Thompson

(57) ABSTRACT

A Fourier transform unit (111) performs Fourier transform on a digital signal on a time axis to generate a frequency domain signal which is a signal on a frequency axis. A filter unit (113) equalizes the frequency domain signal in a frequency domain using N first coefficients. An inverse Fourier transform unit (112) performs inverse Fourier transform on the frequency domain signal processed by the filter unit (113) and returns the frequency domain signal to the digital signal on the time axis. That is, the Fourier transform unit (111), the inverse Fourier transform unit (112), and the filter unit (113) compensate for waveform distortion included in the digital signal using an equalization process (that is, frequency-domain equalization (FDE)) in the frequency domain. A first coefficient setting unit (114) sets N first coefficients used by the filter unit (113) using m (provided N>m) second coefficients.

20 Claims, 21 Drawing Sheets

(51) Int. Cl.
  *H04B 1/12*    (2006.01)
  *H04L 27/10*   (2006.01)
  *H03H 17/02*   (2006.01)
  *H03H 21/00*   (2006.01)

(56) References Cited

U.S. PATENT DOCUMENTS

| | | | | |
|---|---|---|---|---|
| 5,502,507 | A * | 3/1996 | Kim | 348/607 |
| 8,472,814 | B2 * | 6/2013 | Zhang et al. | 398/208 |
| 2003/0128774 | A1 * | 7/2003 | Suzuki et al. | 375/316 |
| 2010/0054759 | A1 | 3/2010 | Oda et al. | |
| 2010/0329697 | A1 * | 12/2010 | Koizumi et al. | 398/208 |
| 2011/0064421 | A1 * | 3/2011 | Zhang et al. | 398/208 |
| 2012/0039607 | A1 | 2/2012 | Ogasahara | |
| 2012/0070159 | A1 * | 3/2012 | Ishihara et al. | 398/202 |

FOREIGN PATENT DOCUMENTS

| | | |
|---|---|---|
| JP | 05-252000 | 9/1993 |
| JP | 2008-205654 | 9/2008 |
| JP | 2010-057016 | 3/2010 |
| JP | 2011-171984 | 9/2011 |

OTHER PUBLICATIONS

M. Kuschnerov, F.N. Hauske, K. Piyawanno, B. Spinnler, A. Napoli, and B. Lankl, "Adaptive Chromatic Dispersion Equalization for Non-Dispersion Managed Coherent Systems", in Optical Fiber Communication Conference, OSA Technical Digest (Optical Society of America, 2009), paper OMT1.

International Search Report PCT/JP2013/000044 dated Apr. 16, 2013.

* cited by examiner

FIG. 7

| H(k) | |
|---|---|
| $Z^{-1}(k)$ | |
| $Z^{-2}(k)$ | |
| ⋮ | ⋮ |
| $Z^{-m}(k)$ | |

DIGITAL SIGNAL PROCESSING DEVICE, RECEIVING DEVICE, AND SIGNAL TRANSMITTING AND RECEIVING SYSTEM

TECHNICAL FIELD

The present invention relates to a digital signal processing device that processes digital signals, a receiving device, and a signal transmitting and receiving system.

BACKGROUND ART

In optical communication or wireless communication, digital signals are transmitted and received. In many cases, a digital signal receiving device compensates for waveform distortion of the digital signal using a digital filter (for example, see Patent Document 1 and Non-patent Document 1).

Patent Document 2 discloses the following technique. First, Fourier transform is performed on a digital signal. Then, a waveform equalization process in a frequency domain is performed on the Fourier-transformed signal by a digital filter. Then, inverse Fourier transform is performed on the result of the waveform equalization process to generate a digital signal.

Non-patent Document 2 discloses a method which switches filter coefficients in a semi-fixed manner using a lookup table (LUT) to control a frequency-domain equalization (FDE) circuit that is difficult to control, thereby performing wavelength dispersion compensation.

RELATED DOCUMENT

Patent Document

[Patent Document 1] Japanese Unexamined Patent Publication No. 2008-205654
[Patent Document 2] Japanese Unexamined Patent Publication No. 2010-057016
[Non-patent Document 1] Seb J. Savory, "Digital filters for coherent optical receivers," Optics Express Vol. 16, No. 2, pp. 804-817 (January 2008).
[Non-patent Document 2]M. Kuschnerov, F. N. Hauske, K. Piyawanno, B. Spinnler, A. Napoli, and B. Lankl, "Adaptive chromatic dispersion equalization for non-dispersion managed coherent systems," in Optical Fiber Communication Conference, OSA Technical Digest (Optical Society of America, 2009), paper OMT1.

DISCLOSURE OF THE INVENTION

In recent years, there has been a demand for increasing the communication speed. When the communication speed increases, the size of a circuit for Fourier transform increases and the number of coefficients of a digital filter increases. When the number of coefficients of the digital filter increases, the number of processes required to set the coefficients increases.

An object of the invention is to provide a digital signal processing device, a receiving device, and a signal transmitting and receiving system which can reduce the number of processes required to set the coefficients of a filter unit.

According to an aspect of the invention, there is provided a digital signal processing device including: a Fourier transform unit that performs Fourier transform on a digital signal to generate a frequency domain signal which is a signal on a frequency axis; a filter unit that equalizes the frequency domain signal in a frequency domain using N first coefficients; an inverse Fourier transform unit that returns the frequency domain signal processed by the filter unit to the digital signal; and a first coefficient setting unit that sets the N first coefficients using m (provided N>m) second coefficients.

According to another aspect of the invention, there is provided a receiving device including: a digital signal acquisition unit that acquires a digital signal; and a digital signal processing unit that processes the digital signal. The digital signal processing unit includes: a Fourier transform unit that performs Fourier transform on the digital signal to generate a frequency domain signal which is a signal on a frequency axis; a filter unit that equalizes the frequency domain signal in a frequency domain using N first coefficients; an inverse Fourier transform unit that returns the frequency domain signal processed by the filter unit to the digital signal; and a first coefficient setting unit that sets the N first coefficients using m (provided N>m) second coefficients.

According to another aspect of the invention, there is provided a signal transmitting and receiving system including: a transmitting unit that transmits a digital signal; and a receiving unit that receives the digital signal. The receiving unit includes: a digital signal acquisition unit that acquires the digital signal; and a digital signal processing unit that processes the digital signal. The digital signal processing unit includes: a Fourier transform unit that performs Fourier transform on the digital signal to generate a frequency domain signal which is a signal on a frequency axis; a filter unit that equalizes the frequency domain signal in a frequency domain using N first coefficients; an inverse Fourier transform unit that returns the frequency domain signal processed by the filter unit to the digital signal; and a first coefficient setting unit that sets the N first coefficients using m (provided N>m) second coefficients.

According to the invention, it is possible to reduce the number of processes required to set the coefficients of a filter unit.

BRIEF DESCRIPTION OF THE DRAWINGS

The above and other objects, features, and advantages of the invention will become apparent from the following preferred exemplary embodiments and the accompanying drawings.

FIG. 7 is a diagram illustrating a fourth example of the process performed by the first coefficient setting unit.

DESCRIPTION OF EMBODIMENTS

Figure 1:
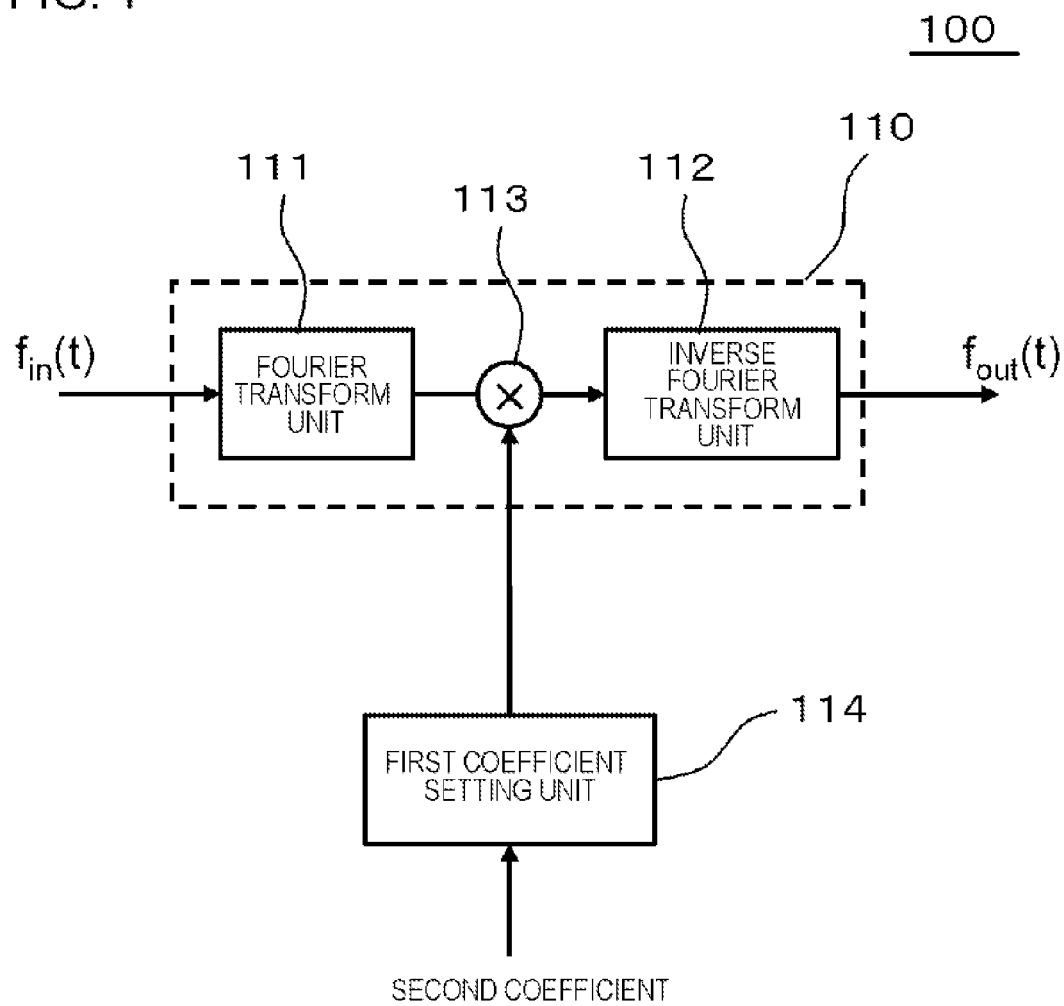
FIG. 1 is a diagram illustrating the structure of a digital processing device according to a first embodiment.

Hereinafter, exemplary embodiments of the invention will be described with reference to the drawings. In all of the drawings, the same components are denoted by the same reference numerals and the description thereof will not be repeated.

First Exemplary Embodiment

FIG. 1 is a diagram illustrating the structure of a digital processing device 100 according to a first exemplary embodiment. The digital processing device 100 includes a digital filter 110. The digital filter 110 includes a Fourier transform unit 111, an inverse Fourier transform unit 112, a filter unit 113, and a first coefficient setting unit 114. The Fourier transform unit 111 performs Fourier transform on a digital signal on a time axis to generate a frequency domain signal which is a signal on a frequency axis. The filter unit 113 equalizes the frequency domain signal in the frequency domain using N first coefficients. The inverse Fourier transform unit 112 performs inverse Fourier transform on the frequency domain signal processed by the filter unit 113 to return the frequency domain signal to the digital signal on the time axis. That is, the Fourier transform unit 111, the inverse Fourier transform unit 112, and the filter unit 113 compensate for waveform distortion included in the digital signal using an equalization process in the frequency domain (that is, frequency-domain equalization (FDE)). The first coefficient setting unit 114 sets N first coefficients which are used by the filter unit 113 using m (provided N>m) second coefficients.

In this embodiment, it is possible to set N first coefficients which are used by the filter unit 113 using m (provided N>m) second coefficients. Therefore, the number of calculation processes required to set the coefficients of the filter unit 113 is reduced. For example, when N is 4096, m<10 can be satisfied. This will be described in detail below.

A digital signal input to the digital filter 110 is a signal which is received by a receiving device in, for example, optical communication or wireless communication. The Fourier transform unit 111 is, for example, a Fourier transform circuit with a size N. The Fourier transform process performed by the Fourier transform unit 111 is discrete Fourier transform (DFT) or fast Fourier transform (FFT). When the Fourier transform unit 111 performs DFT, the inverse Fourier transform unit 112 performs inverse discrete Fourier transform (IDFT). When the Fourier transform unit 111 performs FFT, the inverse Fourier transform unit 112 performs an inverse fast Fourier transform (IFFT) process.

Figure 2:
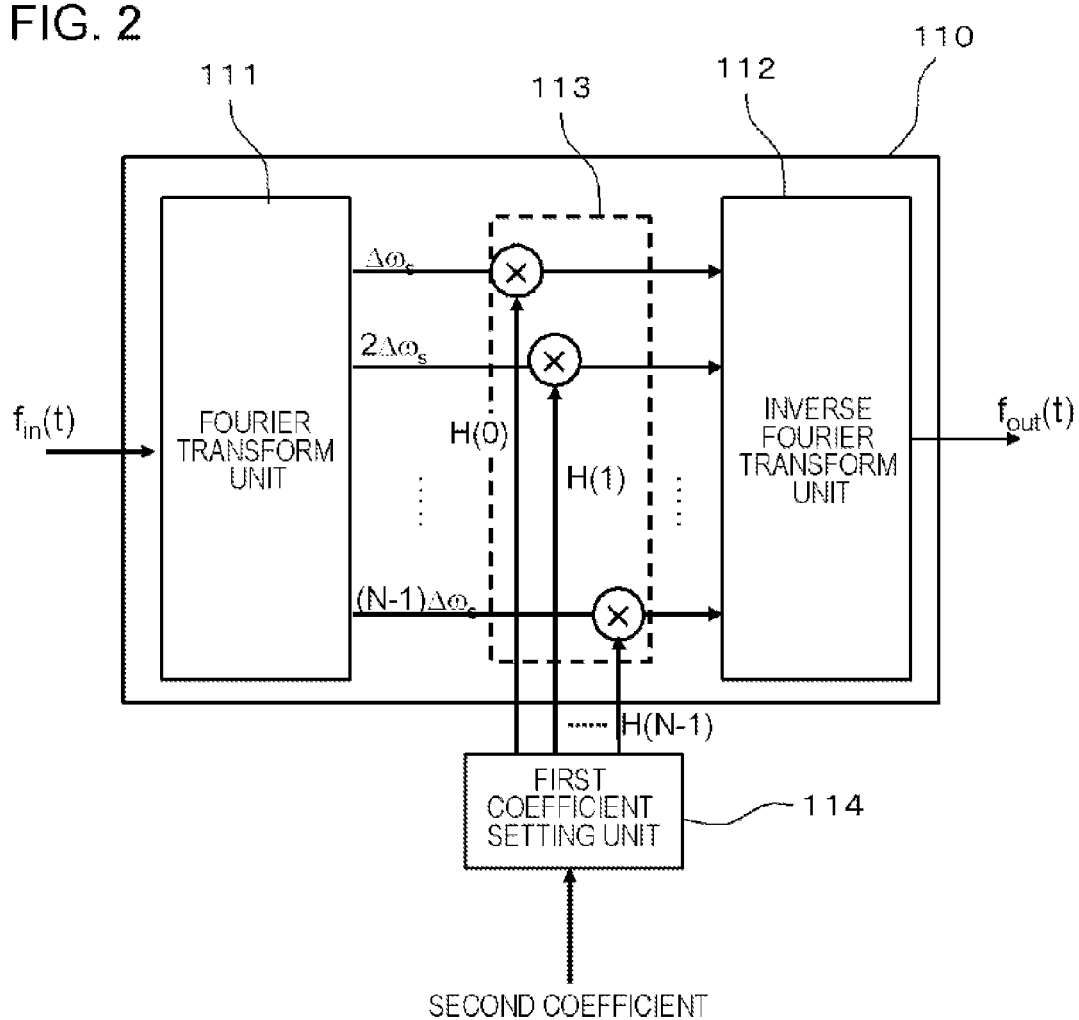
FIG. 2 is a diagram illustrating in detail an example of a digital filter.

FIG. 2 is a diagram illustrating in detail an example of the digital filter 110. The digital filter 110 is, for example, a frequency-domain equalization (FDE) filter. The Fourier transform unit 111 is a Fourier transform circuit with a size N and converts an input digital signal on the time axis into N digital signals on the frequency axis. The converted digital signals are arranged at predetermined frequency intervals $\Delta\omega_s$. In addition, $\Delta\omega_s = 2\pi f_s/N$ is established and $f_s$ is a sampling frequency. The filter unit 113 performs a process of multiplying each of the N digital signals on the frequency axis by a first coefficient $H_x$ ($0 \le x \le N-1$). The first coefficients are set to each of the N digital signals. Therefore, the first coefficient setting unit 114 sets N first coefficients to the filter unit 113. Then, the inverse Fourier transform unit 112 returns the N digital signals multiplied by the first coefficients to the digital signals on the time axis.

Each of the first coefficients and the second coefficients is set for, for example, each frequency. However, the invention is not limited thereto. When the first coefficients and the second coefficients are set for each frequency, the interval between at least some of the second coefficients (or all of the second coefficients) is greater than the interval between the first coefficients on the frequency axis. The first coefficient setting unit 114 sets an approximate function, which approximates the first coefficients using the frequency as a variable, using m second coefficients. Then, the first coefficient setting unit 114 sets the first coefficients on the basis of the approximate function.

The approximate function setting process and the first coefficient setting process are performed by, for example, hardware (a large scale integration (LSI) circuit or a field programmable gate array (FPGA)) or software (a central processing unit (CPU) (that is, a microcomputer) or a personal computer (PC)). In addition, some of these processes may be performed by software and the other processes may be performed by hardware.

Figure 3:
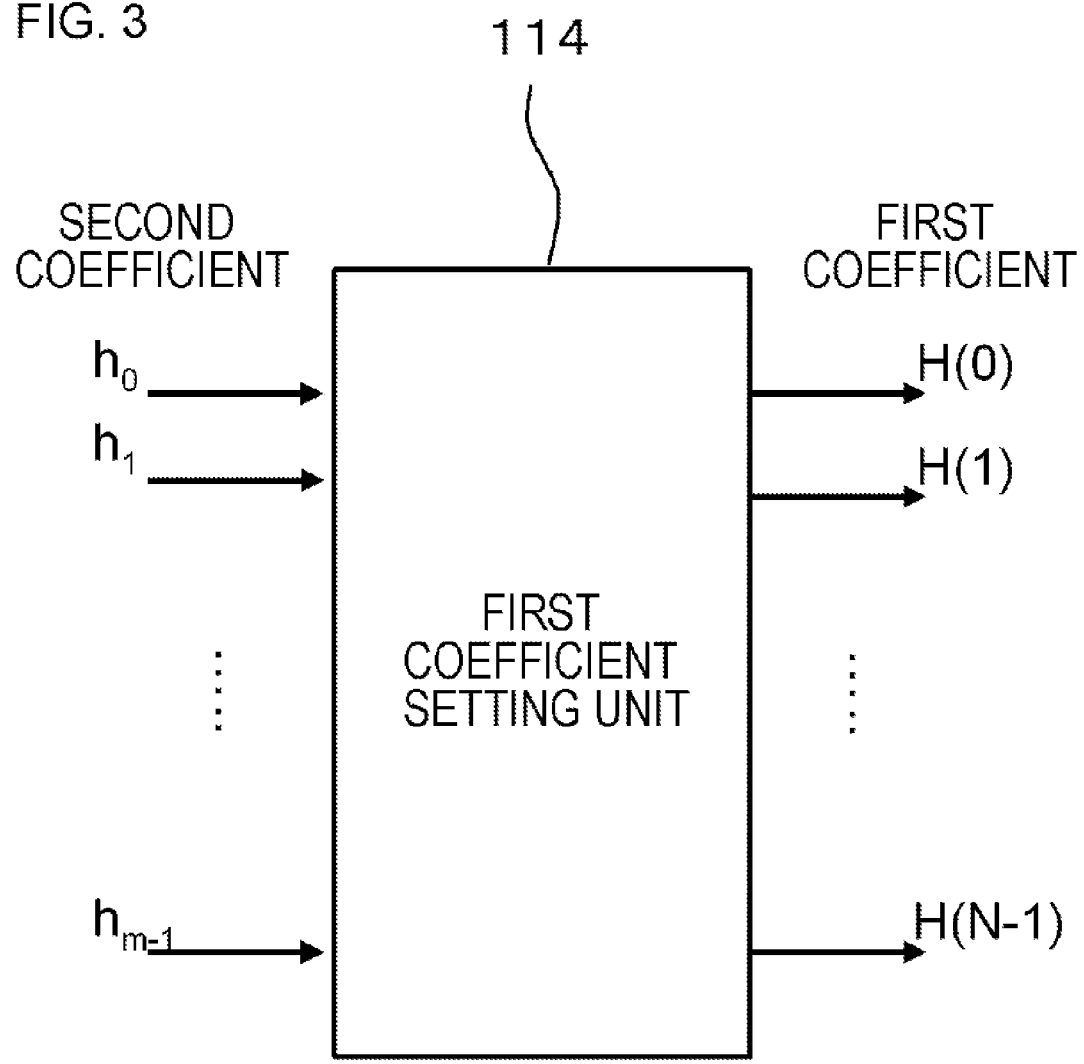
FIG. 3 is a diagram illustrating a process performed by a first coefficient setting unit.

FIG. 3 is a diagram illustrating the process performed by the first coefficient setting unit 114. The first coefficient setting unit 114 sets N digital signals $H_x$ ($0 \le x \le N-1$) using m second coefficients $h_y$ ($0 \le y \le m-1$). The first coefficient setting unit 114 includes, for example, an LSI circuit that receives m second coefficients $h_y$ and outputs N first coefficients $H_x$. There are a plurality of examples of the LSI circuit.

Figure 4:
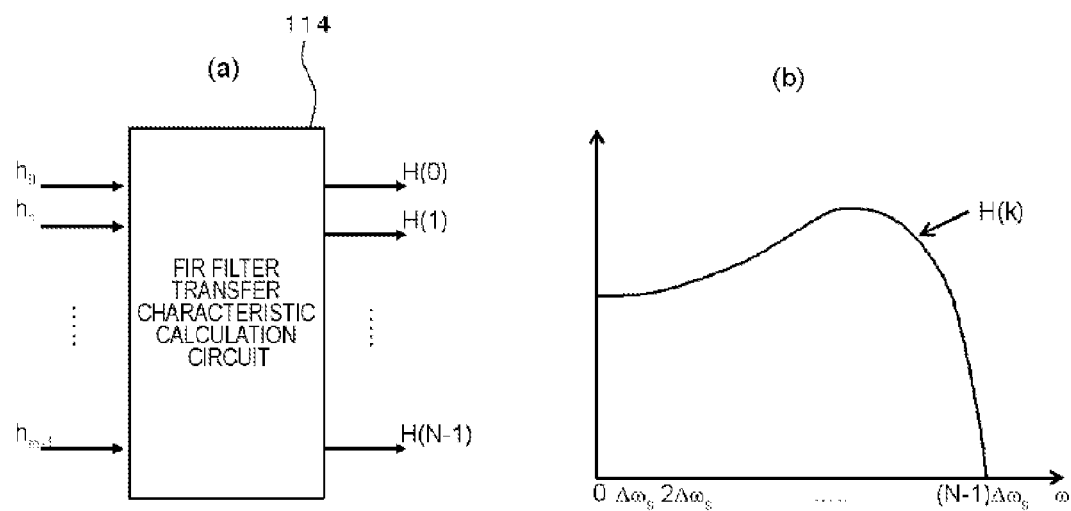
FIG. 4 is a diagram illustrating a first example of the process performed by the first coefficient setting unit.

FIG. 4 is a diagram illustrating a first example of the process performed by the first coefficient setting unit 114. In the first example, the first coefficient setting unit 114 includes a finite impulse response (FIR) filter transfer characteristic calculation circuit, as shown in FIG. 4(a). The FIR filter transfer characteristic calculation circuit performs a calculation process according to the transfer function represented by the following Expression (1).

[Equation 1]

$$H(k) = h_0 + h_1 z^{-1}(k) + \ldots + h_{m-1} z^{-(m-1)}(k) \quad (1)$$

(where $z^{-m}(k) = [\exp(jk\Delta\omega_s T_s)]^{-m} = \exp(-jmk\Delta\omega_s T_s)$ is established (j is an imaginary unit and $T_s = 1/f_s$ is established)).

FIG. 4(b) shows an example of the transfer function represented by Expression (1). The first coefficient setting unit 114 sets the first coefficients $H_x$ at desired ω using the function.

Figure 5:
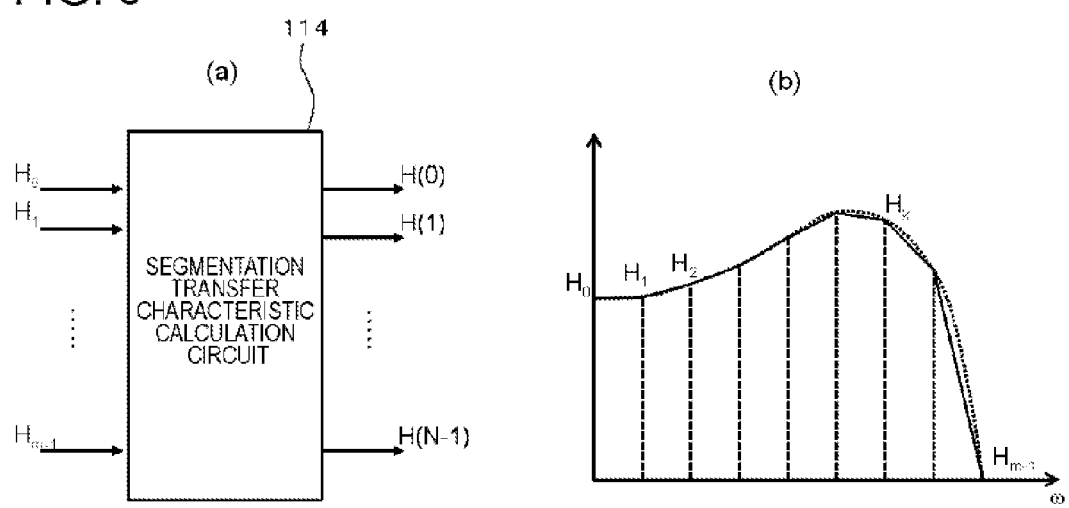
FIG. 5 is a diagram illustrating a second example of the process performed by the first coefficient setting unit.

FIG. 5 is a diagram illustrating a second example of the process performed by the first coefficient setting unit 114. In the second example, the first coefficient setting unit 114 includes a segmentation transfer characteristic calculation circuit as shown in FIG. 5(a). The segmentation transfer characteristic calculation circuit performs the process based on the following idea.

As shown in FIG. 5(b), first, the segmentation transfer characteristic calculation circuit divides the frequency axis (0 to (N−1)Δωs) into m segments. The width of each segment is an integer multiple of Δωs. The segments may have the same width or some segments may have different widths. The second coefficient indicates the boundary value of each segment. The boundary values of the segments are connected by an approximate function (for example, straight-line approximation) and the first coefficients are calculated by the approximate function.

For example, it is assumed that the segment boundary frequencies of a given segment are $k_1\Delta\omega_s$ and $k_2\Delta\omega_s$ ($k_1 < k_2$) and transfer characteristic values at the boundary frequencies are $Hk_1$ and $Hk_2$. In this case, the transfer characteristic value at the frequency $k\Delta\omega_s$ ($k_1 \le k < k_2$) is calculated as $\{(k_2-k)Hk_1+(k-k_1)Hk_2\}/(k_2-k_1)$ by the calculation of an internally dividing point by linear approximation.

Figure 6:
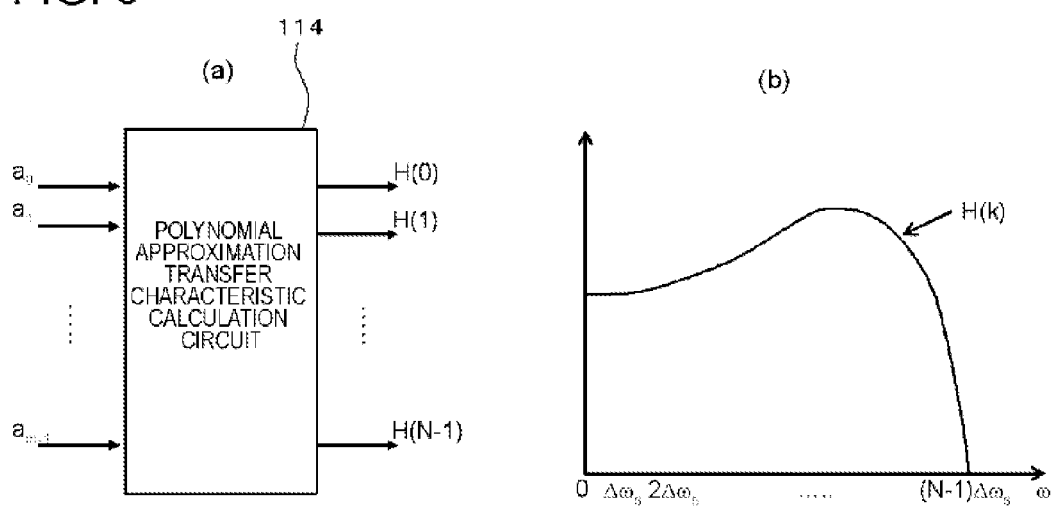
FIG. 6 is a diagram illustrating a third example of the process performed by the first coefficient setting unit.

FIG. 6 is a diagram illustrating a third example of the process performed by the first coefficient setting unit 114. In the third example, the first coefficient setting unit 114 includes a polynomial approximation transfer characteristic calculation circuit as shown in FIG. 6(a). The polynomial approximation transfer characteristic calculation circuit performs a calculation process according to the transfer function represented by the following Expression (2).

[Equation 2]

$$H(k) = a_0 + a_1 k\Delta\omega_s + \ldots + a_{m-1}(k\Delta\omega_s)^{m-1} \quad (2)$$

Here, $a_x$ (0≤x≤m−1) is the second coefficient.

FIG. 6(b) shows an example of the transfer function represented by Expression (2). The first coefficient setting unit 114 sets the first coefficients $H_x$ at desired ω using the function.

Figure 7:
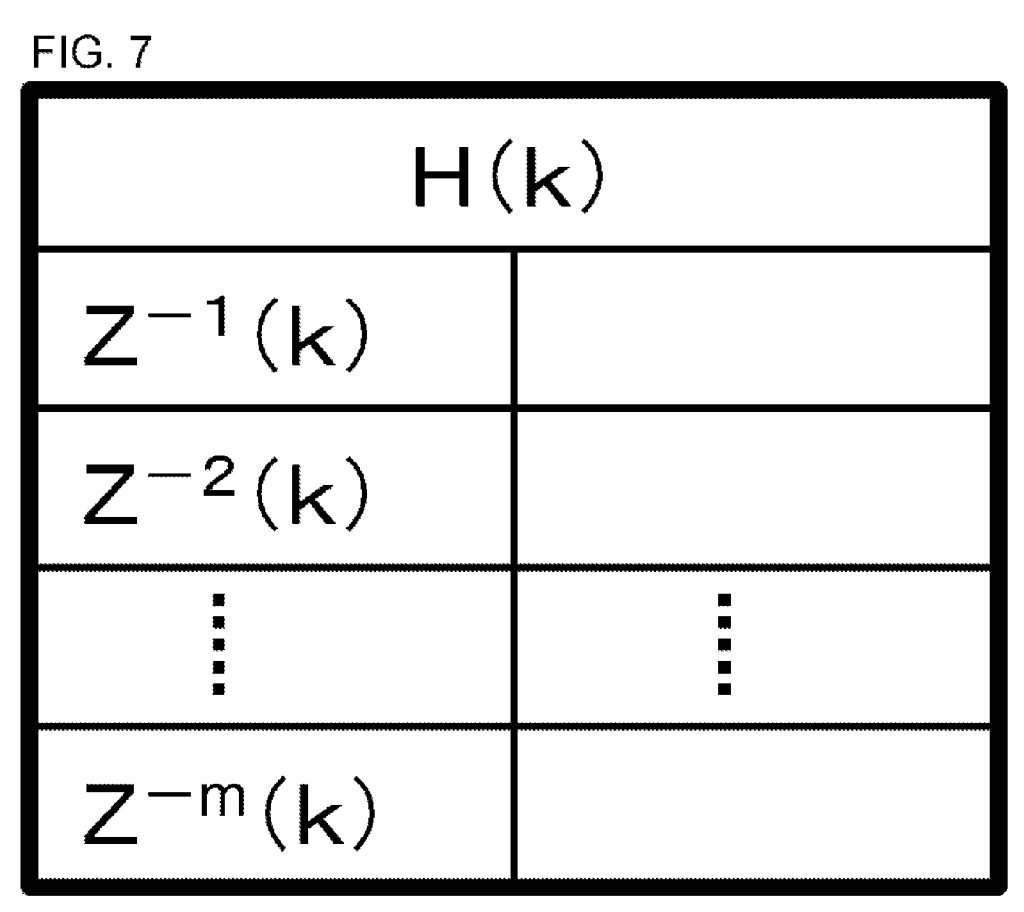

FIG. 7 is a diagram illustrating a fourth example of the process performed by the first coefficient setting unit 114. In the example shown in FIG. 7, the first coefficient setting unit 114 stores a coefficient set of m third coefficients, which respectively correspond to m second coefficients, for each of the N first coefficients. The first coefficient setting unit 114 reads the coefficient set of the third coefficients, which correspond to the first coefficients, for each first coefficient. Then, the first coefficient setting unit 114 multiplies each of the read third coefficients by the second coefficient corresponding to the third coefficient to calculate the first coefficient. In the example shown in FIG. 7, the first coefficient setting unit 114 stores, as the third coefficient, a fixed value to be used instead of $z^{-m}(k)$ in the above-mentioned Expression (1). The fixed value is appropriately updated.

As described above, according to this embodiment, it is possible to set N first coefficients which are used by the filter unit 113 using m (provided N>m) second coefficients. Therefore, the number of calculation processes required to set the coefficients of the filter unit 113 is reduced. Therefore, it is possible to increase the processing speed of the digital processing device 100 and thus to increase the communication speed. In addition, it is possible to reduce the circuit size of the digital processing device 100.

Second Embodiment

Figure 8:
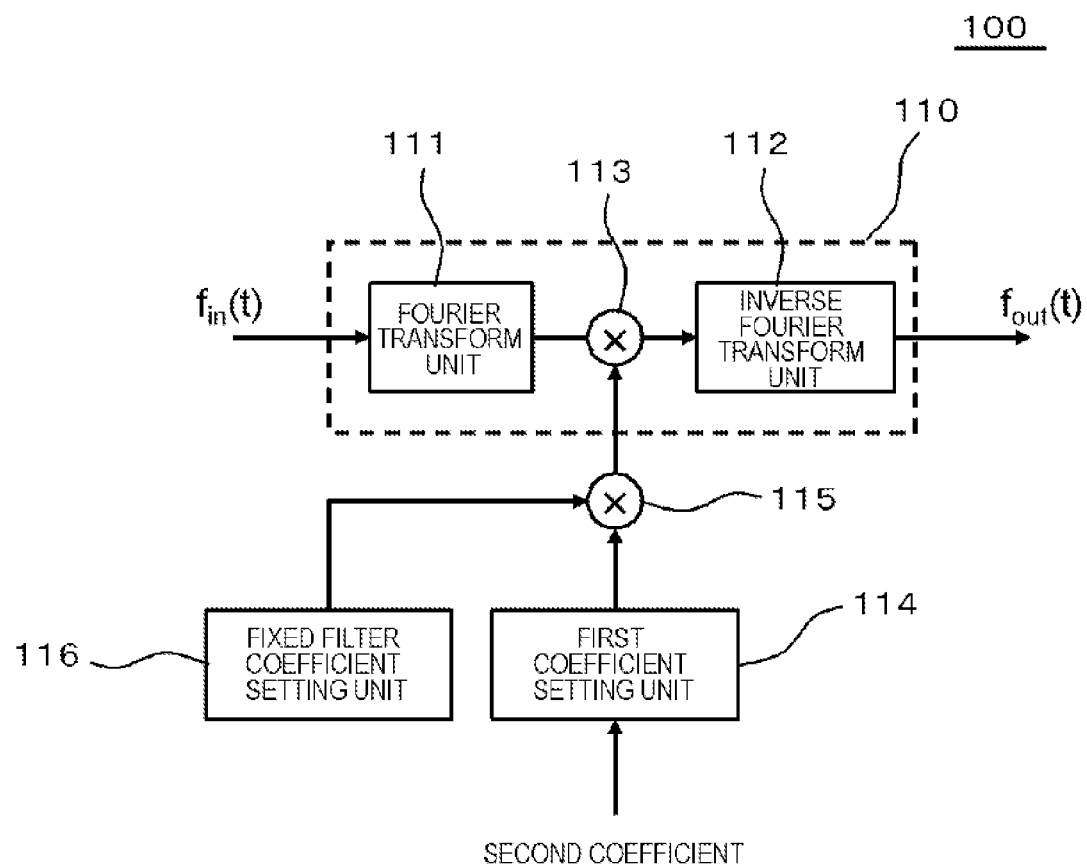
FIG. 8 is a diagram illustrating the structure of a digital processing device according to a second embodiment.

FIG. 8 is a diagram illustrating the structure of a digital processing device 100 according to a second embodiment. The digital processing device 100 according to this embodiment has the same structure as the digital processing device 100 according to the first embodiment except that it includes a fixed filter coefficient setting unit 116 and a multiplier 115.

The fixed filter coefficient setting unit 116 stores a fixed value of a first coefficient. The multiplier 115 multiplies the first coefficient set by a first coefficient setting unit 114 by the first coefficient stored in the fixed filter coefficient setting unit 116 and outputs the multiplied value to a filter unit 113.

In this embodiment, it is possible to obtain the same effect as that in the first embodiment. In addition, the first coefficient stored in the fixed filter coefficient setting unit 116 is corrected with the first coefficient calculated by the first coefficient setting unit 114. Therefore, it is possible to easily set the value of the first coefficient to an appropriate value.

Third Embodiment

Figure 9:
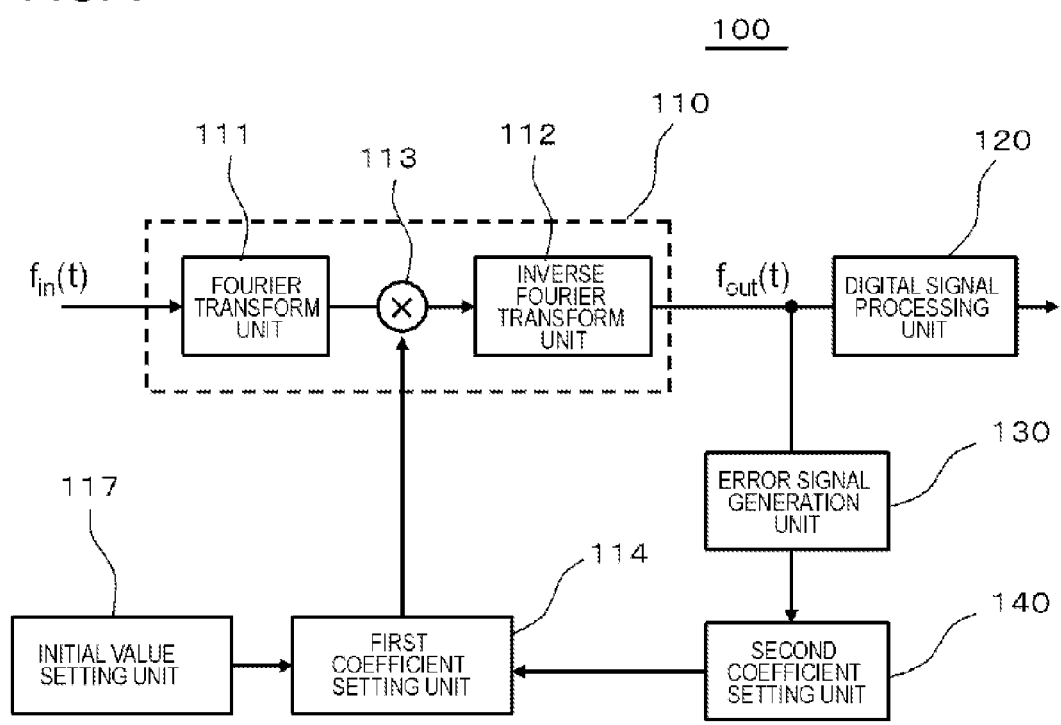
FIG. 9 is a diagram illustrating the structure of a digital processing device according to a third embodiment.

FIG. 9 is a diagram illustrating the structure of a digital processing device 100 according to a third embodiment. The digital processing device 100 according to this embodiment has the same structure as the digital processing device 100 according to the first embodiment except that it includes an initial value setting unit 117, a digital signal processing unit 120, an error signal generation unit 130, and a second coefficient setting unit 140.

The initial value setting unit 117 stores the initial value of the first coefficient used by a first coefficient setting unit 114. The first coefficient is updated by the second coefficient input from the second coefficient setting unit 140 being changed.

The digital signal processing unit 120 is, for example, a digital signal processor (DSP) and processes the digital signal output from the digital filter 110. The digital signal processing unit 120 performs digital signal processing required to receive signals, such as clock regeneration, a demodulation process, and error correction.

The error signal generation unit 130 detects an error in the digital signal output from the digital filter 110 and generates an error signal indicating the detected error. The error signal generation unit 130 performs an error signal calculation process corresponding to the waveform equalization (compensation) algorithm of the digital filter 110. For example, a constant modulus algorithm (CMA), a least mean squares (LMS) algorithm, or a recursive least squares (RLS) algorithm can be used as the waveform equalization (compensation) algorithm. The error signal generation unit 130 calculates an error between a reference signal (for example, a fixed value, a training signal, or a decision directed (DD) signal) and the digital signal output from the digital filter 110 and performs the error signal calculation process corresponding to each waveform equalization (compensation) algorithm.

The second coefficient setting unit 140 receives the error signal generated by the error signal generation unit 130 and sets m second coefficients on the basis of the received error signal. For example, the second coefficient setting unit 140 sets the m second coefficients using a local search method. The m second coefficients set by the second coefficient setting unit 140 are output to the first coefficient setting unit 114.

Here, a detailed example will be described. In this example, CMA is used as the waveform equalization algorithm. The first coefficient setting unit 114 includes the FIR filter transfer characteristic calculation circuit shown in FIG. 4. The second coefficient setting unit 140 processes an error signal $e(t)=1-|f_{out}(t)|^2$ output from the error signal generation unit 130 according to the following Expression (3) to calculate an update value $h'_x(t)$ of the second coefficient.

[Equation 3]

$$\begin{pmatrix} h'_0(t) \\ h'_1(t) \\ \vdots \\ h'_{m-1}(t) \end{pmatrix} = \begin{pmatrix} h_0(t) \\ h_1(t) \\ \vdots \\ h_{m-1}(t) \end{pmatrix} + \mu e(t) f_{out}(t) \text{conj} \begin{pmatrix} f_{in}(t) \\ f_{in}(t-1) \\ \vdots \\ f_{in}(t-m+1) \end{pmatrix} \quad (3)$$

(where $\mu$ is a step size parameter and conj(•) indicates the complex conjugate of (•)).

The second coefficient setting unit 140 repeatedly performs the process using Expression (3). Therefore, even when an input to the digital filter 110 varies over time, the first coefficient setting unit 114 can update the first coefficients following the change.

Figure 10:
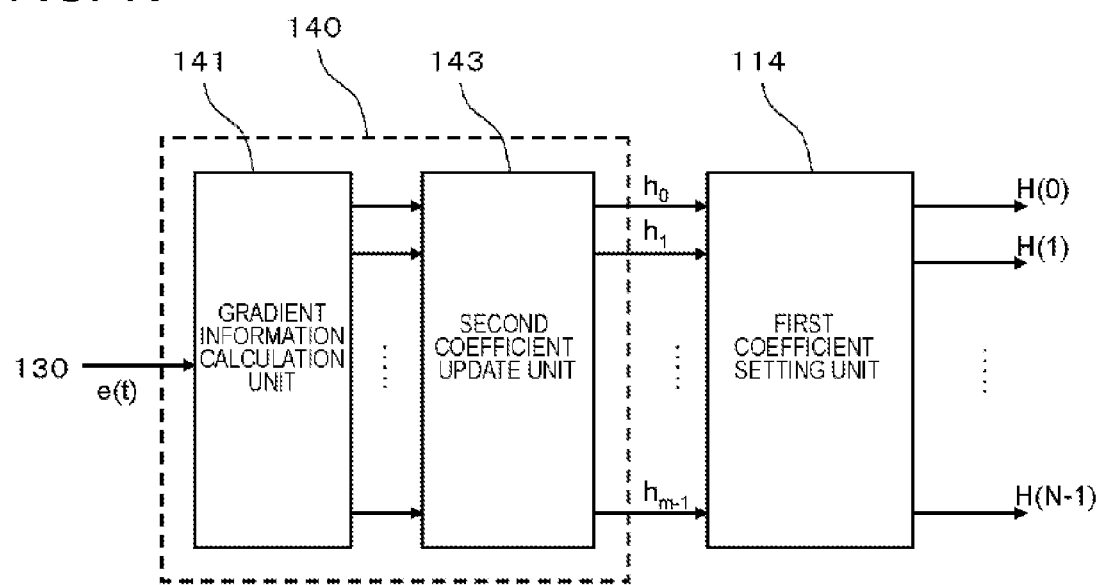
FIG. 10 is a diagram illustrating a first example of the structure of a second coefficient setting unit.

FIG. 10 is a diagram illustrating a first example of the structure of the second coefficient setting unit 140. In this embodiment, the second coefficient setting unit 140 includes a gradient information calculation unit 141 and a second coefficient update unit 143. The gradient information calculation unit 141 generates gradient information indicating the rate of change of the second coefficient. For example, the gradient information is information indicated by the second term on the right side of Expression (3). Specifically, the gradient information is calculated by the following Expression (4).

[Equation 4]

Gradient information of error = (4)

$$\frac{d|e(t)|^2}{dh} = \begin{pmatrix} \frac{\partial |e(t)|^2}{\partial h_0} \\ \frac{\partial |e(t)|^2}{\partial h_1} \\ \vdots \\ \frac{\partial |e(t)|^2}{\partial h_{m-1}} \end{pmatrix} = e(t) f_{out}(t) \text{conj} \begin{pmatrix} f_{in}(t) \\ f_{in}(t-1) \\ \vdots \\ f_{in}(t-m+1) \end{pmatrix}$$

$\because e(t) = 1 - |f_{out}|^2$, $f_{out} = h_0 f_{in}(t) + h_1 f_{in}(t-1) + \ldots + h_{m-1} f_{in}(t-m+1)$ The second coefficient update unit 143 updates the second coefficients using the gradient information calculated by the gradient information calculation unit 141. The second coefficient update unit 143 performs the process using, for example, a steepest descent method using CMA, LMS, or RLS or a conjugate gradient method.

Figure 11:
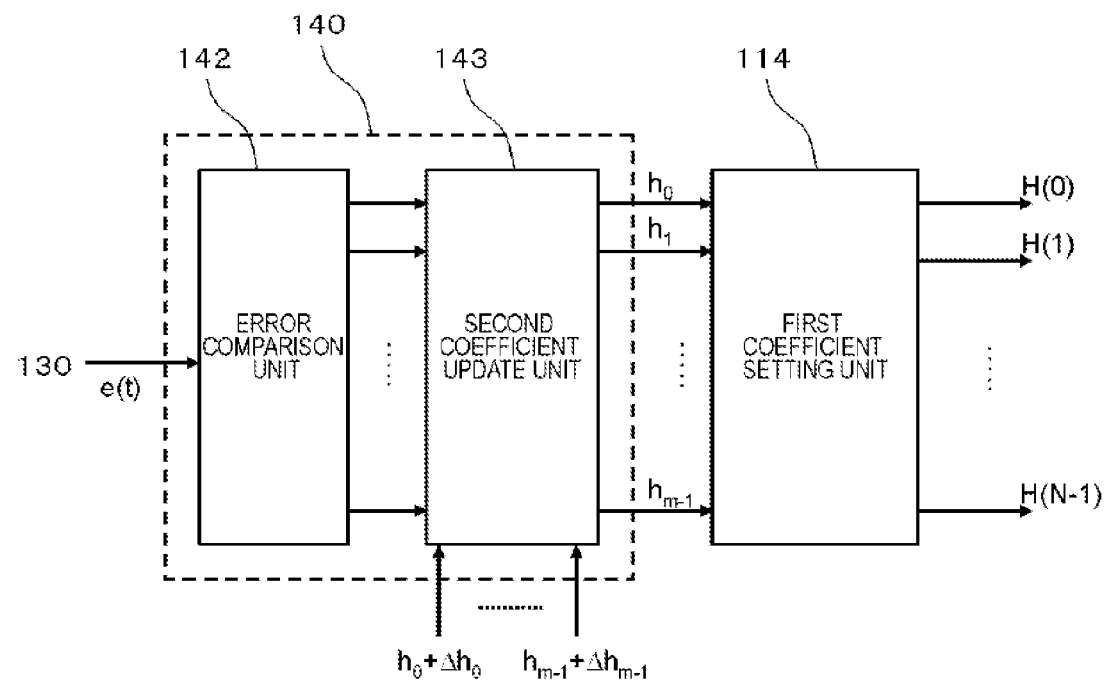
FIG. 11 is a diagram illustrating a second example of the structure of the second coefficient setting unit.

FIG. 11 is a diagram illustrating a second example of the structure of the second coefficient setting unit 140. In the example shown in FIG. 11, the second coefficient setting unit 140 includes an error comparison unit 142 and the second coefficient update unit 143.

The second coefficient update unit 143 changes the second coefficients by a first small amount in the vicinity of the second coefficients $h_0$ to $h_{m-1}$ at a time t ($h_0+h1_0$ to $h_{m-1}+\Delta h1_{m-1}$). In addition, the second coefficient update unit 143 changes the second coefficients by a second small amount in the vicinity of the second coefficients $h_0$ to $h_{m-1}$ ($h_0+\Delta h2_0$ to $h_{m-1}+\Delta h2_{m-1}$). Then, the error comparison unit 142 compares an error signal $e_1$ when the second coefficient is changed by the first small amount with an error signal $e_2$ when the second coefficient is changed by the second small amount. The second coefficient update unit 143 sequentially changes the update amounts $\Delta h_0$ to $\Delta h_{m-1}$ of the second coefficients such that the difference between the error signals is reduced, on the basis of the comparison result obtained by the error comparison unit 142. In this case, the error comparison unit 142 can use a local search method, such as a hill climbing method, an iterative improvement method, or a neighborhood search method.

Figure 12:
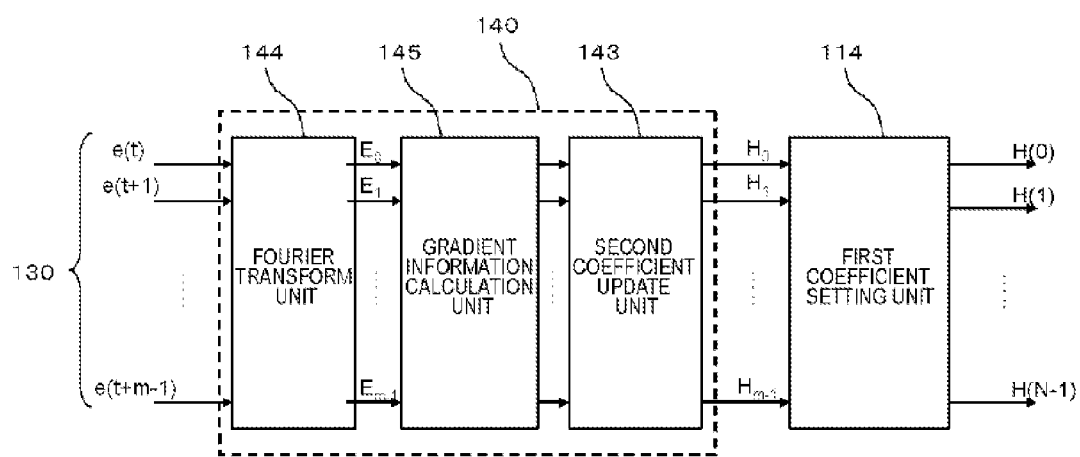
FIG. 12 is a diagram illustrating a third example of the structure of the second coefficient setting unit.

FIG. 12 is a diagram illustrating a third example of the structure of the second coefficient setting unit 140. In the examples shown in FIGS. 10 and 11, the second coefficient setting unit 140 performs sequential update in order to update the second coefficients. In contrast, in the example shown in FIG. 12, the second coefficient setting unit 140 performs block signal processing using m error signals e(t) to e(t+m−1) as the second coefficients to calculate the first coefficients.

Specifically, the second coefficient setting unit 140 includes a Fourier transform unit 144, a gradient information calculation unit 145, and the second coefficient update unit 143. The Fourier transform unit 144 performs Fourier transform on m error information items e(t+X) (0≤X≤m−1), which are information items on the time axis, to generate signals Ex (0≤X≤m−1) on the frequency axis. Then, the gradient information calculation unit 145 performs the same process as that performed on the second coefficients by the gradient information calculation unit 141 on the signals Ex (0≤X≤m−1) on the frequency axis to generate the gradient information of an error in the frequency domain. The second coefficient update unit 143 sets the second coefficients (in the example shown in FIG. 12, $H_x$ (0≤X≤m−1)) using the gradient information generated by the gradient information calculation unit 145. Then, the first coefficient setting unit 114 sets the first coefficients using, for example, the method which has been described with reference to FIG. 5.

In this example, the Fourier transform unit 144 may not be provided. In this case, the second coefficient setting unit 140 performs block signal processing in the time domain, similarly to the examples shown in FIGS. 10 and 11.

As described above, in this embodiment, it is possible to obtain the same effect as that in the first embodiment. In addition, the second coefficient setting unit 140 sets the second coefficients using the error signal generated by the error signal generation unit 130. Therefore, even when an input to the digital filter 110 varies over time, the first coefficient setting unit 114 can update the first coefficients following the change.

Fourth Embodiment

Figure 13:
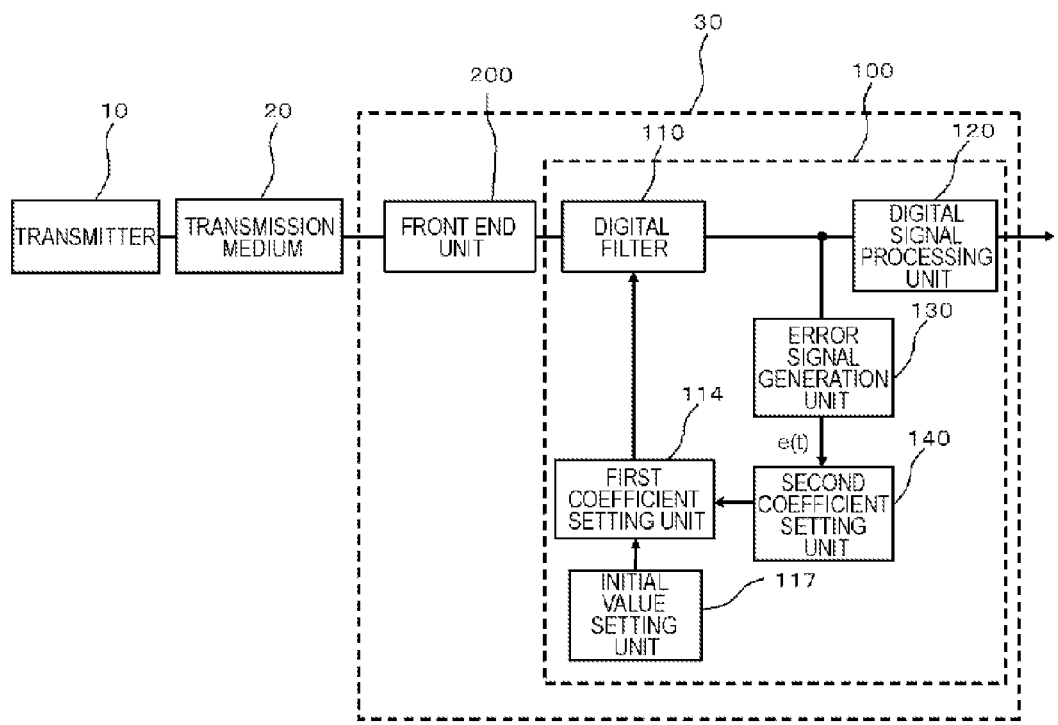
FIG. 13 is a diagram illustrating the structure of a signal transmitting and receiving system according to a third embodiment.

FIG. 13 is a diagram illustrating the structure of a signal transmitting and receiving system according to the third embodiment. The signal transmitting and receiving system shown in FIG. 13 includes a transmitter 10 and a receiving device 30. The transmitting device 10 generates digital signals and transmits the digital signals to the receiving device 30. A transmission medium 20 is provided between the transmitting device 10 and the receiving device 30. When wired communication is performed between the transmitting device 10 and the receiving device 30, the transmission medium 20 is, for example, an optical fiber. When wireless communication is performed between the transmitting device 10 and the receiving device 30, the transmission medium 20 is space.

The receiving device 30 includes a digital processing device 100 and a front end unit 200. For example, the digital processing device 100 has the same structures as those according to the first to third embodiments. In the example shown in FIG. 13, the digital processing device 100 has the same structure as that according to the third embodiment.

The front end unit 200 (digital signal acquisition unit) receives the signal transmitted from the transmitting device 10. Then, the front end unit 200 converts the received signal into a signal which can be processed by the digital processing device 100.

Figure 14:
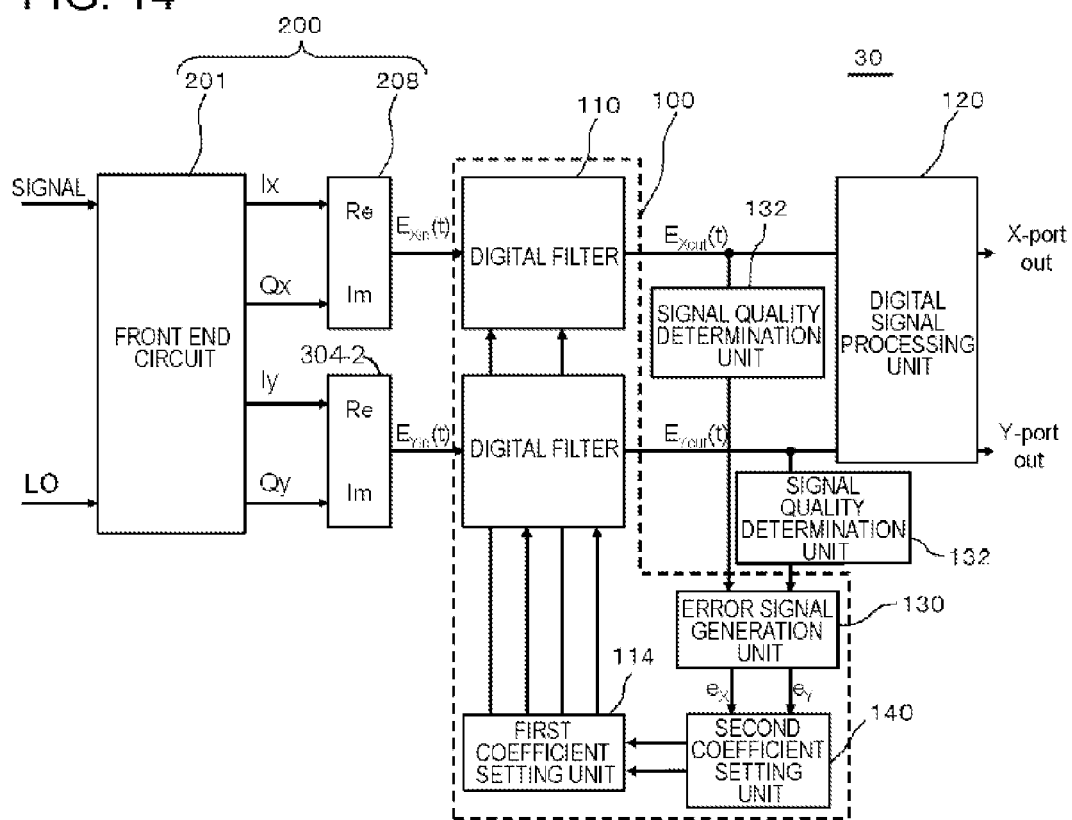
FIG. 14 is a diagram illustrating the detailed structure of a receiving device.

FIG. 14 is a diagram illustrating in detail the structure of the receiving device 30. In the example shown in FIG. 14, the front end unit 200 includes a front end circuit 201 and a complex signal generation unit 208. The front end circuit 201 generates 4-channel signals Ix, Qx, Iy, and Qy using the signal received from the transmitting device 10 and a reference signal LO. The complex signal generation unit 208 generates 2-channel complex signals $E_{xin}(t)=Ix+jQ(x)$ and $E_{yin}(t)=Iy+jQ(y)$ using the signals Ix, Qx, Iy, and Qy (where j is an imaginary unit).

In addition, the digital processing device 100 includes two digital filters 110. A first digital filter 110 processes the complex signal $E_{xin}(t)=Ix+jQ(x)$ and a second digital filter 110 processes the complex signal $E_{yin}(t)=Iy+jQ(y)$. The processes performed by the two digital filters 110 are the same as those in the first to third embodiments.

The receiving device 30 includes two signal quality determination units 132. A first signal quality determination unit 132 determines the signal quality of an output $E_{xout}(t)$ from the first digital filter 110. Specifically, the first signal quality determination unit 132 generates a waveform distortion signal indicating the waveform distortion of the output $E_{out}(t)$ on the basis of the waveform distortion of the output $E_{xout}(t)$. The generated waveform distortion signal is input to an error signal generation unit 130.

A second signal quality determination unit 132 determines the signal quality of an output $E_{yout}(t)$ from the second digital filter 110. Specifically, the second signal quality determination unit 132 generates a waveform distortion signal indicating the waveform distortion of the output $E_{yout}(t)$ on the basis of the waveform distortion of the output $E_{yout}(t)$. The generated waveform distortion signal is input to the error signal generation unit 130.

Then, the error signal generation unit 130 generates two types of error signals on the basis of the two waveform distortion signals. A second coefficient setting unit 140 sets the second coefficients for x and y on the basis of each of the two types of error signals. Then, a first coefficient setting unit 114 sets the first coefficients for x and y.

In this embodiment, it is possible to obtain the same effect as that in the first to third embodiments. In the example shown in FIGS. 13 and 14, the error signal generation unit 130 sets the error signal using the waveform distortion signal generated by the signal quality determination unit 132. Therefore, when the error signal generation unit 130, the second coefficient setting unit 140, and the first coefficient setting unit 114 are incorporated into the receiving device 30 including the signal quality determination unit 132, it is not necessary to add a new detection circuit for generating the error signal to the digital processing device 100.

Fifth Embodiment

Figure 15:
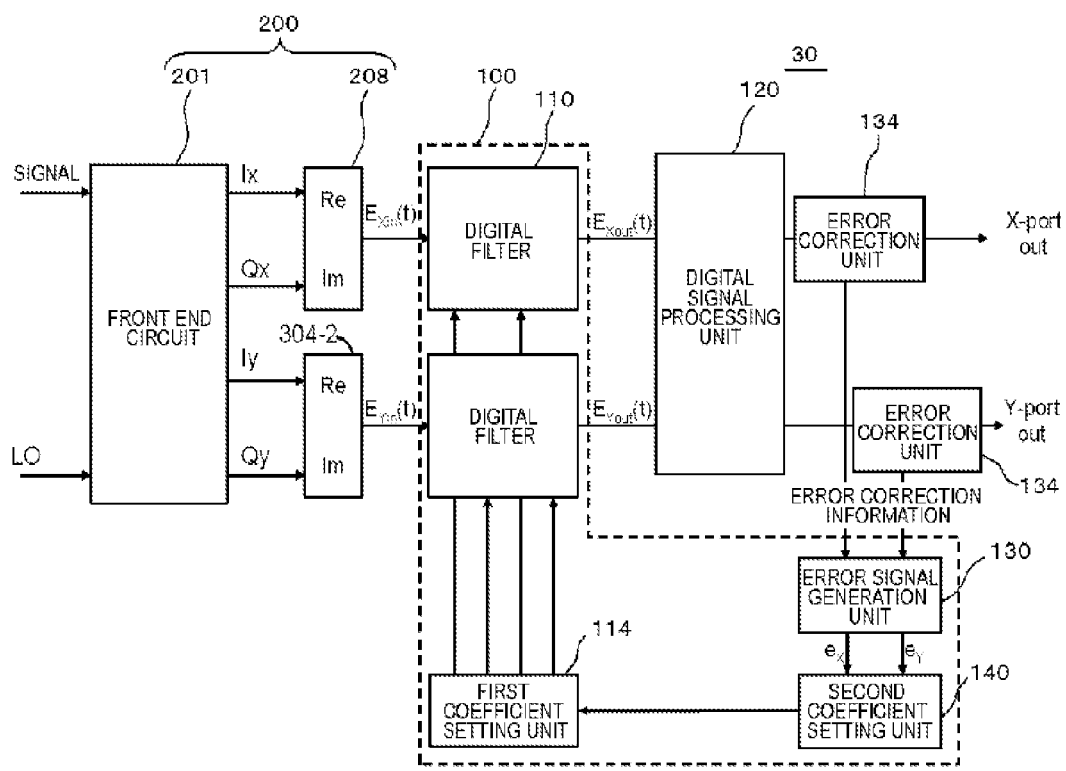
FIG. 15 is a diagram illustrating the structure of a receiving device used in a signal transmitting and receiving system according to a fifth embodiment.

FIG. 15 is a diagram illustrating the structure of a receiving device 30 used in a signal transmitting and receiving system according to a fifth embodiment. The signal transmitting and receiving system according to this embodiment has the same structure as the signal transmitting and receiving system according to the fourth embodiment except for the structure of the receiving device 30.

The receiving device 30 according to this embodiment has the same structure as the receiving device 30 according to the fourth embodiment except that it includes an error correction unit 134, instead of the signal quality determination unit 132. The error correction unit 134 corrects an error in the digital signal output from a digital signal processing unit 120. In addition, the error correction unit 134 outputs error correction information indicating the corrected content of the digital signal to an error signal generation unit 130. The error signal generation unit 130 generates an error signal on the basis of the error correction signal.

In this embodiment, it is possible to obtain the same effect as that in the first to third embodiments. In the example shown in FIG. 15, the error signal generation unit 130 sets the error signal using the error correction information generated by the error correction unit 134. Therefore, when the error signal generation unit 130, a second coefficient setting unit 140, and a first coefficient setting unit 114 are incorporated into the receiving device 30 including the error correction unit 134, it is not necessary to add a new detection circuit for generating the error signal to a digital processing device 100.

Sixth Embodiment

A signal transmitting and receiving system according to this embodiment has the same structure as the signal transmitting and receiving system according to the fifth embodiment except that it transmits and receives signals using digital coherent technology. That is, in this embodiment, signals are transmitted by optical communication. Multilevel modulation is performed on an optical signal using, for example, a polarization multiplexing system or a quadrature amplitude modulation (QAM) system.

Figure 16:
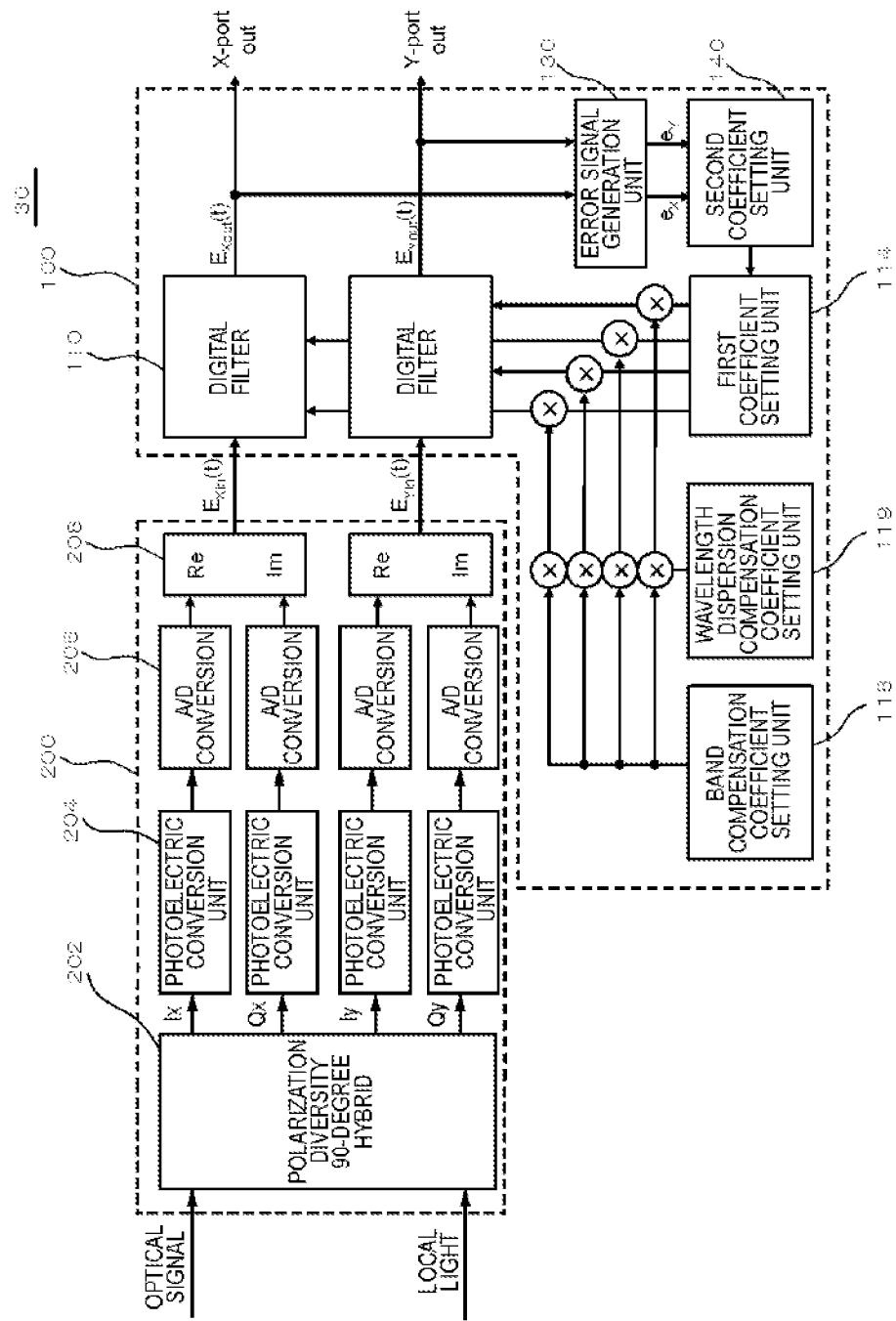
FIG. 16 is a diagram illustrating the structure of a receiving device used in a signal transmitting and receiving system according to a sixth embodiment.

FIG. 16 is a diagram illustrating the structure of a receiving device 30 used in the signal transmitting and receiving system according to the sixth embodiment. In FIG. 16, a digital signal processing unit 120 is not shown. The receiving device 30 includes a front end unit 200 and a digital processing device 100.

The front end unit 200 includes an optical hybrid 202, a photoelectric conversion unit 204, an analog-digital (AD) conversion unit 206, and a complex signal generation unit 208.

Signal light from a transmission path and local light from a local light source are input to the optical hybrid 202. The optical hybrid 202 makes the optical signal interfere with the local light with a phase difference of 0 to generate a first optical signal ($I_x$) and makes the optical signal interfere with the local light with a phase difference of $\pi/2$ to generate a second optical signal ($Q_x$). In addition, the optical hybrid 202 makes the optical signal interfere with the local light with a phase difference of 0 to generate a third optical signal ($I_y$) and makes the optical signal interfere with the local light with a phase difference of $\pi/2$ to generate a fourth optical signal ($Q_y$). The first optical signal and the second optical signal form a set of signals and the third optical signal and the fourth optical signal form a set of signals.

The photoelectric conversion unit 204 performs photoelectric conversion on four optical signals (output light) generated by the optical hybrid 202 to generate four analog signals.

The AD conversion unit 206 converts the four analog signals generated by the photoelectric conversion unit 204 into digital signals.

The complex signal generation unit 208 generates 2-channel complex signals $E_{xin}(t)=Ix+jQ(x)$ and $E_{yin}(t)=Iy+jQ(y)$ using signals Ix, Qx, Iy, and Qy.

The digital processing device 100 includes a band compensation coefficient setting unit 118 and a wavelength dispersion compensation coefficient setting unit 119. The band compensation coefficient setting unit 118 stores a coefficient for compensating for wavelength dispersion caused by the front end unit 200. Then, the coefficient stored in the wavelength dispersion compensation coefficient setting unit 119 and the coefficient stored in the band compensation coefficient setting unit 118 are multiplied by a first coefficient set by a first coefficient setting unit 114. The multiplied first coefficient is output to a digital filter 110.

Information stored in the band compensation coefficient setting unit 118 and the wavelength dispersion compensation coefficient setting unit 119 is a semi-fixed value and is, for example, manually updated as necessary. The digital processing device 100 may include a storage unit which stores a coefficient for skew compensation and a storage unit which stores a coefficient for I-Q imbalance compensation. The coefficients stored in the storage units are multiplied by the first coefficient set by the first coefficient setting unit 114.

Figure 17:
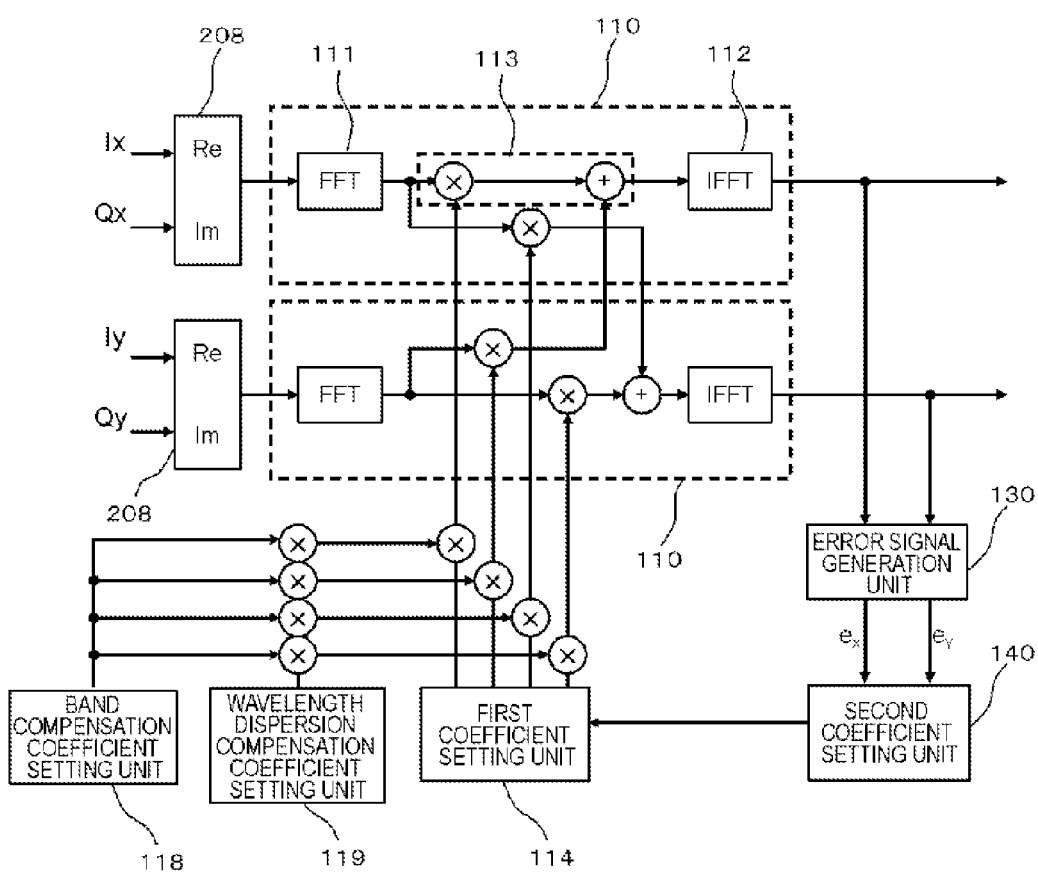
FIG. 17 is a diagram illustrating the structure of a digital filter shown in FIG. 16.

FIG. 17 is a diagram illustrating the structure of the digital filter 110 shown in FIG. 16. In this embodiment, a plurality of digital signals (specifically, two digital signals) are provided. A Fourier transform unit 111, an inverse Fourier transform unit 112, and a filter unit 113 are provided for each of the two digital signals. Two Fourier transform units 111, two inverse Fourier transform units 112, and two filter units 113 form a butterfly circuit.

Figure 18:
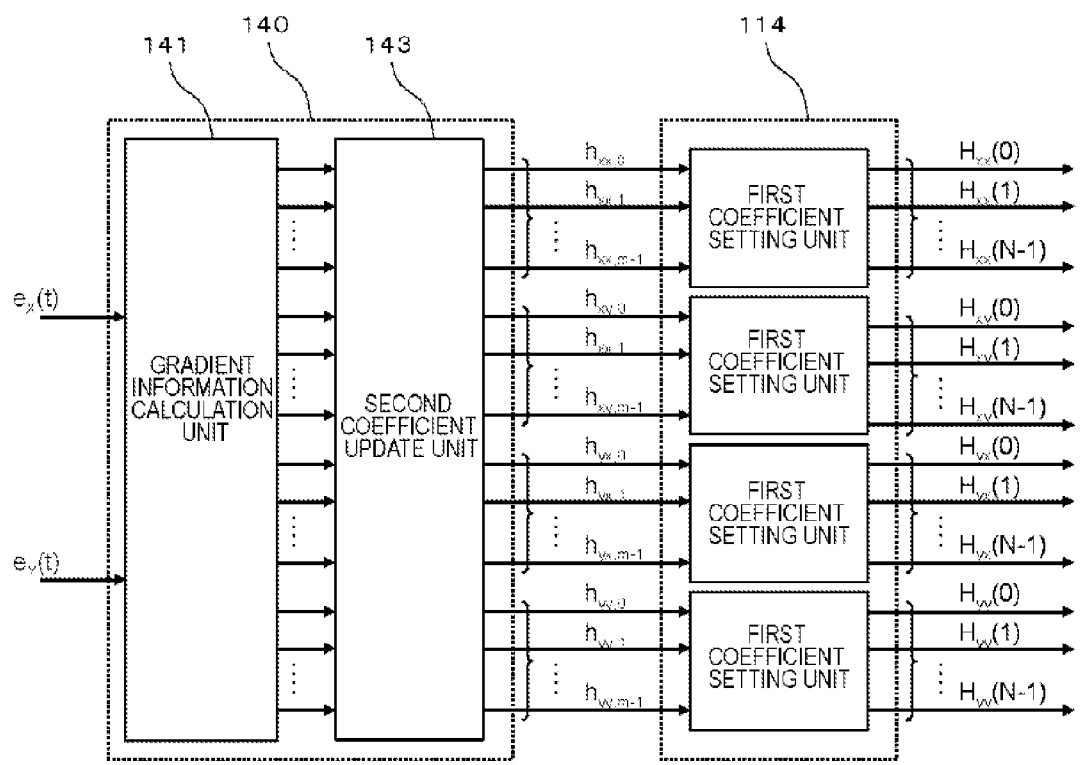
FIG. 18 is a diagram illustrating an example of the structure of a second coefficient setting unit and a first coefficient setting unit in the sixth embodiment.

FIG. 18 is a diagram illustrating an example of the structure of the second coefficient setting unit 140 and the first coefficient setting unit 114 in this embodiment. In the example shown in FIG. 18, the second coefficient setting unit 140 performs the process which has been described with reference to FIG. 10. Specifically, the second coefficient setting unit 140 includes a gradient information calculation unit 141 and a second coefficient update unit 143. The gradient information calculation unit 141 calculates gradient information for each of four signals Ix, Qx, Iy, and Qy. The second coefficient update unit 143 sets the second coefficient to each of the four signals Ix, Qx, Iy, and Qy. The first coefficient setting unit 114 sets the first coefficient to each of the four signals Ix, Qx, Iy, and Qy.

In this embodiment, it is possible to obtain the same effect as that in the fifth embodiment. In the receiving device which is used in digital coherent technology, it is possible to reduce the number of calculation processes required to set the coefficients of the digital filter 110.

Seventh Embodiment

A signal transmitting and receiving system according to this embodiment has the same structure as the signal transmitting and receiving system according to the fifth embodiment except that it transmits and receives signals using wireless communication.

Figure 19:
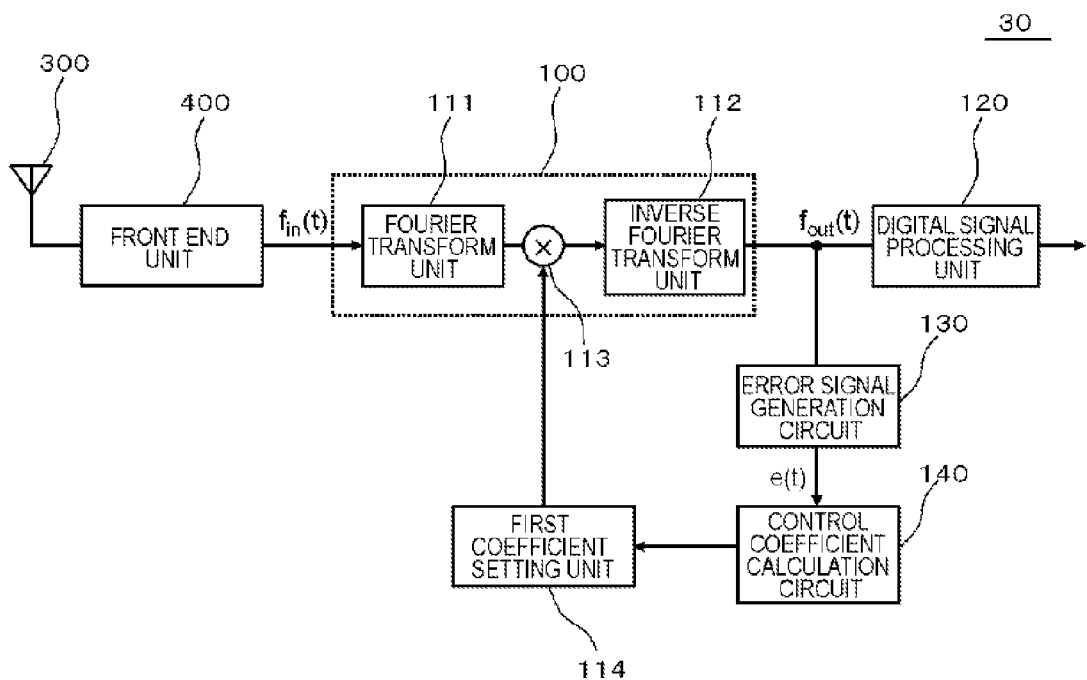
FIG. 19 is a diagram illustrating the structure of a receiving device according to a seventh embodiment.

FIG. 19 is a diagram illustrating the structure of a receiving device 30 according to this embodiment. In this embodiment, the receiving device 30 includes an antenna 300, a front end unit 400, a digital processing device 100, a first coefficient setting unit 114, a digital signal processing unit 120, an error signal generation unit 130, and a second coefficient setting unit 140. The digital processing device 100, the first coefficient setting unit 114, the digital signal processing unit 120, the error signal generation unit 130, and the second coefficient setting unit 140 have the same structures as those in the second to sixth embodiments.

The antenna 300 receives signals which are wirelessly transmitted. The front end unit 400 processes the signal received by the antenna 300 and outputs the processed digital signal to the digital processing device 100.

Figure 20:
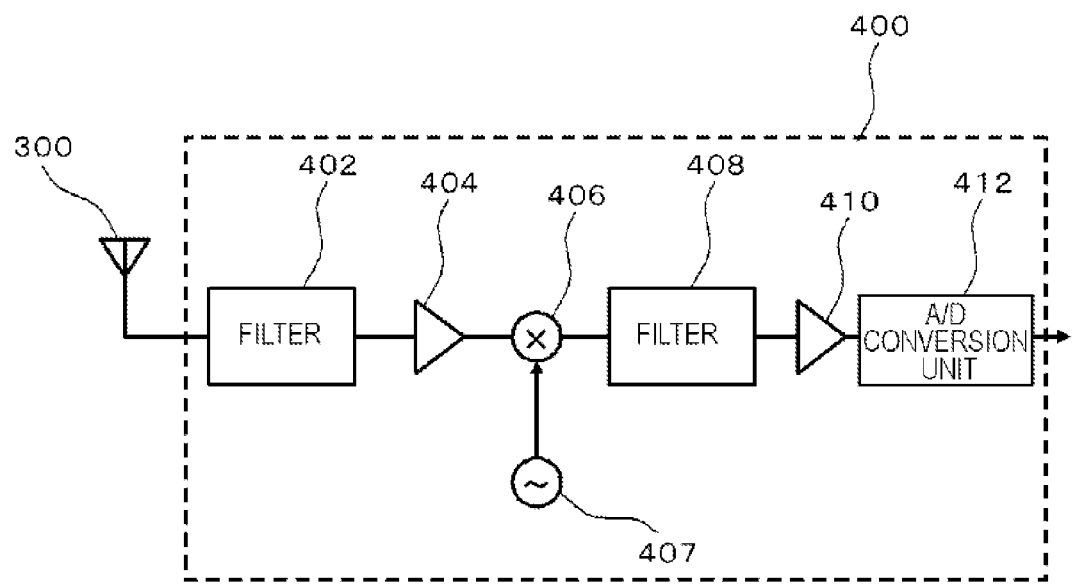
FIG. 20 is a diagram illustrating the functional structure of a front end unit.

FIG. 20 is a diagram illustrating the functional structure of the front end unit 400. The front end unit 400 includes a filter 402, a low noise amplifier 404, a mixer 406, a reference signal source 407, a filter 408, a variable gain amplifier 410, and an AD conversion unit 412. The filter 402 removes a frequency component, which is noise, from the signal received by the antenna 300. The low noise amplifier 404 amplifies an analog signal output from the filter 402. The mixer 406 multiplies the analog signal output from the low noise amplifier 404 by a reference signal generated by the reference signal source 407. The filter 408 removes a frequency component, which is noise, from the analog signal output from the mixer 406. The variable gain amplifier 410 amplifies the analog signal output from the filter 408. The AD conversion unit 412 converts the analog signal output from the variable gain amplifier 410 into a digital signal.

The front end unit 400 may not include at least one (including the case of all) of the filter 402, the low noise amplifier 404, the mixer 406, the reference signal source 407, the filter 408, and the variable gain amplifier 410. In this case, in the front end unit 400, the AD conversion unit 412 directly converts the signal received by the antenna 300 into a digital signal.

According to this embodiment, in the receiving device used in wireless communication, it is possible to reduce the number of calculation processes required to set the coefficients of a digital filter 110.

Eighth Embodiment

A signal transmitting and receiving system according to this embodiment has the same structure as the signal transmitting and receiving system according to the seventh embodiment except that wireless communication is performed by a multiple-input multiple-output (MIMO) system.

Figure 21:
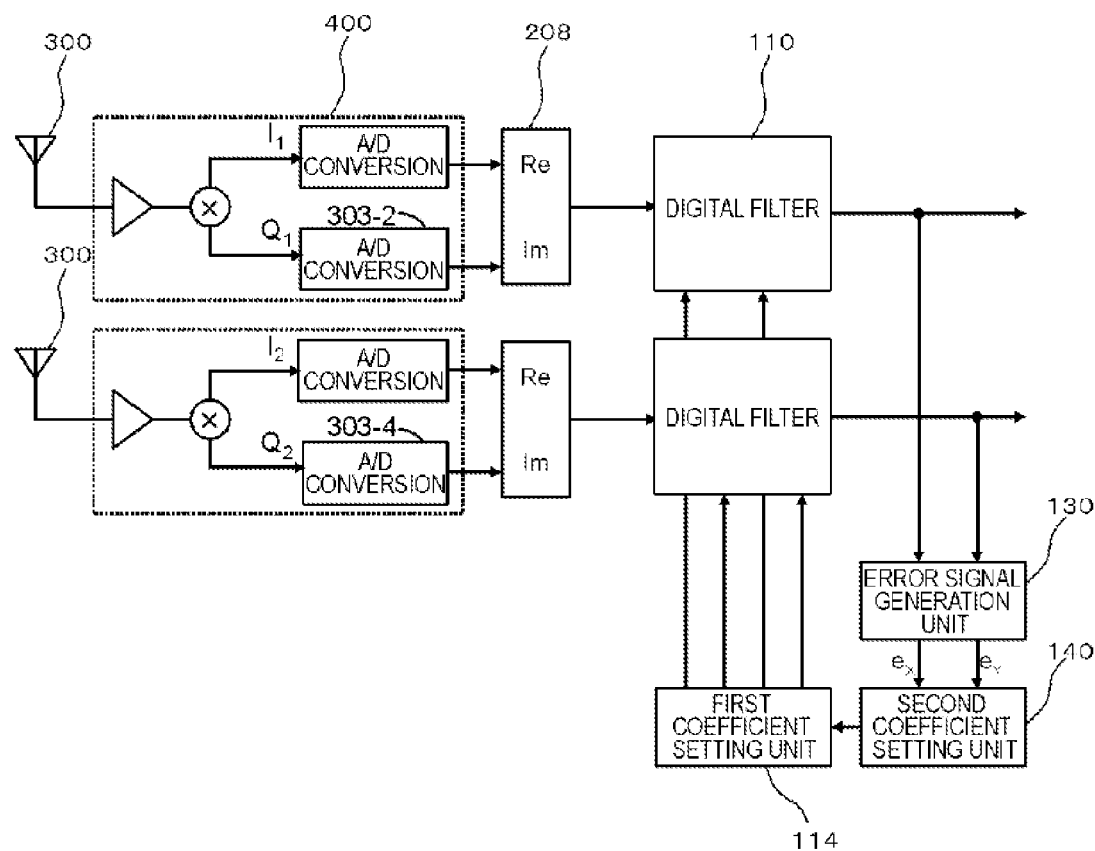
FIG. 21 is a diagram illustrating the structure of a receiving device according to an eighth embodiment.

FIG. 21 is a diagram illustrating the structure of a receiving device 30 according to the eighth embodiment. In this embodiment, the receiving device 30 includes a plurality of sets of antennas 300, front end units 400, complex signal generation units 208, and digital filters 110. The front end unit 400 extracts a real component ($I_n$) and an imaginary component ($Q_n$) from an analog signal received by the antenna 300 and performs AD conversion on the real and imaginary components. The processes of the complex signal generation unit 208 onward are the same as those which have been described with reference to, for example, FIGS. 14 to 18.

According to this embodiment, in the receiving device which is used in MIMO wireless communication, it is possible to reduce the number of calculation processes required to set the coefficients of the digital filter 110.

The embodiments of the invention have been described above with reference to the drawings. However, the above-described embodiments are illustrative examples of the invention and the invention can adopt various structures other than the above-mentioned structures.

This application claims priority from Japanese Patent Application No. 2012-45962, filed Mar. 1, 2012, the content of which is incorporated herein by reference in its entirety.

The invention claimed is:

1. A digital signal processing device comprising:
a Fourier transform device that performs Fourier transform on a digital signal to generate a frequency domain signal which is a signal on a frequency axis;
a filter device that equalizes the frequency domain signal in a frequency domain using N first coefficients;
an inverse Fourier transform device that returns the frequency domain signal processed by the filter device to the digital signal; and
a first coefficient setting device that sets the N first coefficients using m (provided N>m) second coefficients, N and m being integers greater than zero,
wherein at least one interval between the second coefficients is greater than an interval between the first coefficients.

2. The digital signal processing device according to claim 1,
wherein the first coefficient and the second coefficient are set for each frequency, and
the first coefficient setting device sets an approximate function, which approximates the first coefficients using the frequency as a variable, using the m second coefficients, and sets the first coefficients on a basis of the approximate function.

3. The digital signal processing device according to claim 1,
wherein the first coefficient setting device includes a circuit that receives the m second coefficients and outputs the N first coefficients.

4. The digital signal processing device according to claim 3,
wherein the circuit is a finite impulse response (FIR) filter transfer characteristic calculation circuit, a segmentation transfer characteristic calculation circuit, or a polynomial approximation transfer characteristic calculation circuit.

5. The digital signal processing device according to claim 1,
wherein the first coefficient setting device stores a coefficient set of m third coefficients corresponding respectively to the m second coefficients for each of the N first coefficients, and
each of the m third coefficients included in the coefficient set corresponding to each first coefficient is multiplied by the second coefficient corresponding to the third coefficient to calculate the first coefficient.

6. The digital signal processing device according to claim 1, further comprising:
a second coefficient setting device that receives an error signal indicating an error in the digital signal generated by the inverse Fourier transform device and sets the m second coefficients on a basis of the error signal.

7. The digital signal processing device according to claim 6, further comprising:
an error signal generation device that generates the error signal on a basis of a difference between a reference signal and the digital signal generated by the inverse Fourier transform device.

8. The digital signal processing device according to claim 6, further comprising:
an error signal generation device that generates the error signal from error correction information indicating that an error in the digital signal generated by the inverse Fourier transform device has been corrected.

9. The digital signal processing device according to claim 6, further comprising:
an error signal generation device that generates the error signal on a basis of waveform distortion of the digital signal generated by the inverse Fourier transform device.

10. The digital signal processing device according to claim 6,
wherein the second coefficient setting device sets the m second coefficients using a local search method.

11. The digital signal processing device according to claim 1,
wherein a plurality of the digital signals are input, the Fourier transform device, the filter device, and the inverse Fourier transform device are provided for each of the plurality of digital signals, and
the plurality of Fourier transform device, the plurality of filter units devices, and the plurality of inverse Fourier transform units devices form a butterfly circuit.

12. A receiving device comprising:
a digital signal acquisition device that acquires a digital signal; and
a digital signal processing device that processes the digital signal,
wherein the digital signal processing device includes:
a Fourier transform device that performs Fourier transform on the digital signal to generate a frequency domain signal which is a signal on a frequency axis;
a filter device that equalizes the frequency domain signal in a frequency domain using N first coefficients;
an inverse Fourier transform device that returns the frequency domain signal processed by the filter device to the digital signal; and
a first coefficient setting device that sets the N first coefficients using m (provided N>m) second coefficients, N and m being integers greater than zero,
wherein at least one interval between the second coefficients is greater than an interval between the first coefficients.

13. The receiving device according to claim 12, further comprising:
a photoelectric conversion device that performs photoelectric conversion on an optical signal to generate an analog signal,
wherein the digital signal acquisition device converts the analog signal into the digital signal to obtain the digital signal.

14. A signal transmitting and receiving system comprising:
a transmitting device that transmits a digital signal; and
a receiving device that receives the digital signal, wherein the receiving device includes:
a digital signal acquisition device that acquires the digital signal; and
a digital signal processing device that processes the digital signal, and
the digital signal processing device includes:
a Fourier transform device that performs Fourier transform on the digital signal to generate a frequency domain signal which is a signal on a frequency axis;
a filter device that equalizes the frequency domain signal in a frequency domain using N first coefficients;
an inverse Fourier transform device that returns the frequency domain signal processed by the filter device to the digital signal; and
a first coefficient setting device that sets the N first coefficients using m (provided N>m) second coefficients, N and m being integers greater than zero, wherein at least one interval between the second coefficients is greater than an interval between the first coefficients.

15. A digital signal processing device comprising:
a Fourier transform means that performs Fourier transform on a digital signal to generate a frequency domain signal which is a signal on a frequency axis;
a filter means that equalizes the frequency domain signal in a frequency domain using N first coefficients;
an inverse Fourier transform means that returns the frequency domain signal processed by the filter means to the digital signal; and
a first coefficient setting means that sets the N first coefficients using m (provided N>m) second coefficients, N and m being integers greater than zero,
wherein at least one interval between the second coefficients is greater than an interval between the first coefficients.

16. A receiving device comprising:
a digital signal acquisition means that acquires a digital signal; and
a digital signal processing means that processes the digital signal,
wherein the digital signal processing means includes:
a Fourier transform means that performs Fourier transform on the digital signal to generate a frequency domain signal which is a signal on a frequency axis;
a filter means that equalizes the frequency domain signal in a frequency domain using N first coefficients;
an inverse Fourier transform means that returns the frequency domain signal processed by the filter means to the digital signal; and
a first coefficient setting means that sets the N first coefficients using m (provided N>m) second coefficients, N and m being integers greater than zero,
wherein at least one interval between the second coefficients is greater than an interval between the first coefficients.

17. A signal transmitting and receiving system comprising:
a transmitting means that transmits a digital signal; and
a receiving means that receives the digital signal,
wherein the receiving means includes:
a digital signal acquisition means that acquires the digital signal; and
a digital signal processing means that processes the digital signal, and
the digital signal processing means includes:
a Fourier transform means that performs Fourier transform on the digital signal to generate a frequency domain signal which is a signal on a frequency axis;
a filter means that equalizes the frequency domain signal in a frequency domain using N first coefficients;
an inverse Fourier transform means that returns the frequency domain signal processed by the filter means to the digital signal; and
a first coefficient setting means that sets the N first coefficients using m (provided N>m) second coefficients, N and m being integers greater than zero,
wherein at least one interval between the second coefficients is greater than an interval between the first coefficients.

18. The digital signal processing device according to claim 2, further comprising:
a second coefficient setting device that receives an error signal indicating an error in the digital signal generated by the inverse Fourier transform device and sets the m second coefficients on the basis of the error signal.

19. The digital signal processing device according to claim 3, further comprising:
a second coefficient setting device that receives an error signal indicating an error in the digital signal generated by the inverse Fourier transform device and sets the m second coefficients on a basis of the error signal.

20. The digital signal processing device according to claim 4, further comprising: a second coefficient setting device that receives an error signal indicating an error in the digital signal generated by the inverse Fourier transform unit device and sets the m second coefficients on a basis of the error signal.

* * * * *